(12) United States Patent
Zhou et al.

(10) Patent No.: US 9,142,755 B2
(45) Date of Patent: *Sep. 22, 2015

(54) PERPENDICULAR MAGNETIC RANDOM ACCESS MEMORY (MRAM) DEVICE WITH A STABLE REFERENCE CELL

(71) Applicant: Avalanche Technology, Inc., Fremont, CA (US)

(72) Inventors: Yuchen Zhou, San Jose, CA (US); Yiming Huai, Pleasanton, CA (US)

(73) Assignee: Avalanche Technology, Inc., Fremont, CA (US)

( * ) Notice: Subject to any disclaimer, the term of this patent is extended or adjusted under 35 U.S.C. 154(b) by 302 days.

This patent is subject to a terminal disclaimer.

(21) Appl. No.: 13/938,891

(22) Filed: Jul. 10, 2013

(65) Prior Publication Data

US 2013/0292785 A1 Nov. 7, 2013

Related U.S. Application Data

(63) Continuation-in-part of application No. 13/360,524, filed on Jan. 27, 2012, now Pat. No. 8,559,215, and a continuation-in-part of application No. 13/360,553, filed on Jan. 27, 2012, now Pat. No. 8,830,736, and a (Continued)

(51) Int. Cl.
*G11C 11/00* (2006.01)
*H01L 43/02* (2006.01)
(Continued)

(52) U.S. Cl.
CPC .............. *H01L 43/02* (2013.01); *G11C 11/161* (2013.01); *G11C 11/5607* (2013.01)

(58) Field of Classification Search
CPC ....................................................... G11C 11/00

USPC .......... 365/48, 55, 62, 66, 74, 78, 80–93, 100, 365/130, 131, 148, 158, 171–173, 209, 213, 365/225.5, 230.07, 232, 243.5; 977/933–935
See application file for complete search history.

(56) References Cited

U.S. PATENT DOCUMENTS

2005/0083747 A1 * 4/2005 Tang et al. ..................... 365/210
2006/0067149 A1 * 3/2006 Shimizu et al. ............... 365/210

(Continued)

*Primary Examiner* — Harry W Byrne
(74) *Attorney, Agent, or Firm* — Maryam Imam; Bing K. Yen

(57) ABSTRACT

A magnetic random access memory (MRAM) element is configured to store a state when electric current flows therethrough. The MRAM element includes a first magnetic tunnel junction (MTJ) for storing a data bit and a reference bit MTJ for storing a reference bit. The data bit MTJ and reference bit MTJ are preferred to be of identical structure that includes a magnetic free layer (FL) having a switchable magnetization with a direction that is perpendicular to a film plane. The direction of magnetization of the FL is determinative of the data bit stored in the at least one MTJ. The identical structure further includes a magnetic reference layer (RL) having a magnetization with a direction that is perpendicular to the film plane, and a magnetic pinned layer (PL) having a magnetization with a direction that is perpendicular to the film plane. The direction of magnetization of the RL and the PL are anti-parallel relative to each other in the data bit MTJ for storing data bit, wherein when electric current is applied to the first MTJ, the magnetization orientation of the FL switches during a write operation, whereas, the direction of magnetization the RL and the PL remain the same. The direction of magnetization of the FL, the RL and the PL are parallel relative to each other in the reference bit MTJ for storing reference bit, the magnetization orientation of the FL does not switch under normal read operations.

36 Claims, 14 Drawing Sheets

Related U.S. Application Data continuation-in-part of application No. 13/223,070, filed on Aug. 31, 2011.

(60) Provisional application No. 61/510,025, filed on Jul. 20, 2011.

(51) Int. Cl.
*G11C 11/16* (2006.01)
*G11C 11/56* (2006.01)

(56) References Cited

U.S. PATENT DOCUMENTS

2006/0233017 A1* 10/2006 Hosotani et al. ............. 365/158
2009/0268515 A1* 10/2009 Jeong et al. ................... 365/171
2010/0109110 A1* 5/2010 Wang et al. ................... 257/421

* cited by examiner

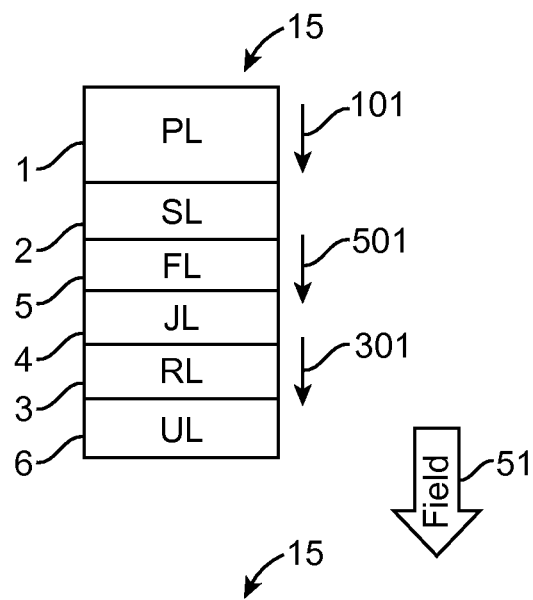
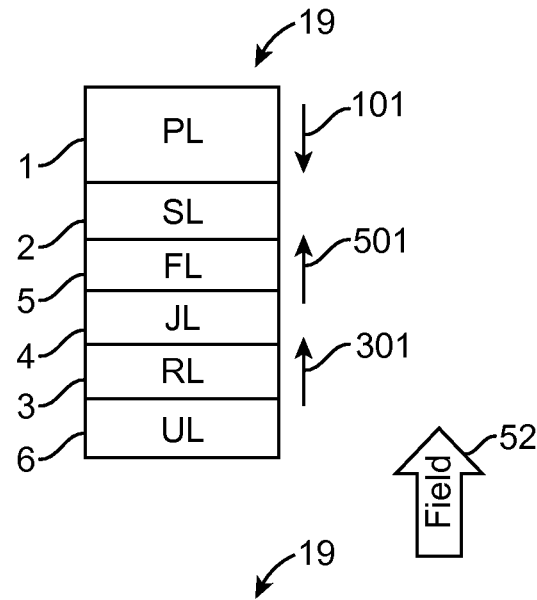
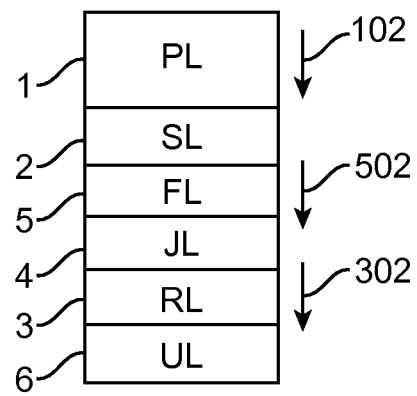
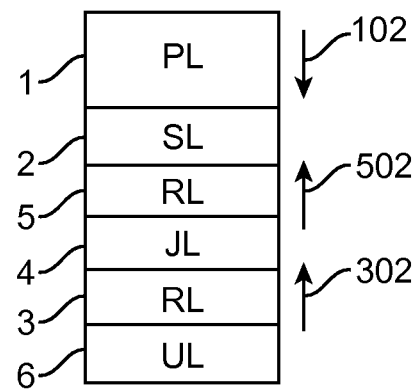
FIG. 15　　　　　　　FIG. 16

PERPENDICULAR MAGNETIC RANDOM ACCESS MEMORY (MRAM) DEVICE WITH A STABLE REFERENCE CELL

CROSS REFERENCE TO RELATED APPLICATIONS

This application is a continuation in part of previously-filed U.S. Provisional application Ser. No. 13/360,524, entitled, "PERPENDICULAR MRAM DEVICE AND ITS INITIALIZATION METHOD", filed by Yuchen Zhou, et al., on Jan. 27, 2012, which claims priority to previously-filed U.S. Provisional Application No. 61/510,025, entitled "PERPENDICULAR MRAM DEVICE AND ITS INITIALIZATION METHOD", filed by Yuchen Zhou, et al., on Jul. 20, 2011, and is a continuation in part of previously-filed U.S. Provisional application Ser. No. 13/360,553, entitled, "INITIALIZATION METHOD OF A PERPENDICULAR MAGNETIC RANDOM ACCESS MEMORY (MRAM) DEVICE WITH A STABLE REFERENCE CELL", filed by Yuchen Zhou, et al., on Jan. 27, 2012, which claims priority to previously-filed U.S. Provisional Application No. 61/510,025, entitled "PERPENDICULAR MRAM DEVICE AND ITS INITIALIZATION METHOD", filed by Yuchen Zhou, et al., on Jul. 20, 2011, and is a continuation in part of previously-filed U.S. Provisional application Ser. No. 13/223,070, entitled, "INITIALIZATION METHOD OF A PERPENDICULAR MAGNETIC RANDOM ACCESS MEMORY (MRAM) DEVICE", filed by Yuchen Zhou on Jul. 11, 2012, which claims priority to previously-filed U.S. Provisional Application No. 61/510,025, entitled "PERPENDICULAR MRAM DEVICE AND ITS INITIALIZATION METHOD", filed by Yuchen Zhou, et al., on Jul. 20, 2011.

BACKGROUND OF THE INVENTION

1. Field of the Invention

The invention relates generally to non-volatile magnetic memory and particularly to non-uniform switching of non-volatile magnetic based memory.

2. Description of the Prior Art

Computers conventionally use rotating magnetic media, such as hard disk drives (HDDs), for data storage. Though widely used and commonly accepted, such media suffer from a variety of deficiencies, such as access latency, higher power dissipation, large physical size and inability to withstand any physical shock. Thus, there is a need for a new type of storage device devoid of such drawbacks.

There has been an extensive effort in development of alternative technologies such as Ovanic Ram (or phase-change memory), Ferromagnetic Ram (FeRAM), Magnetic Ram (MRAM), Nanochip, and others to replace memories used in current designs such as DRAM, SRAM, EEPROM/NOR flash, NAND flash and HDD in one form or another. Although these various memory/storage technologies have created many challenges, there have been advances made in this field in recent years. MRAM has exceptional advantage when compared to other memory technologies under development in the aspects of speed, write endurance and non-volatility.

Perpendicular MRAM is particularly noteworthy because of its adaptability to sub-30 nano meters (nm) size and high density. However, thermal stability has been a continued problem faced in the design of perpendicular MRAM and is described by thermal stability factor, $\Delta$, described as follows:

$$\Delta = K_u V / k_B T \qquad \text{Eq. (1)}$$

where "$K_u$" is the perpendicular anisotropy energy density of the storage magnetic layer of the MRAM, "V" is the volume of the storage magnetic layer, "$k_B$" is the Boltzmann constant, and "T" is the absolute temperature (in Kelvin).

This factor inevitably reduces at a given anisotropy energy of the storage magnetic layer resulting in the thermal stability of each bit decreasing. For MRAM applications using extremely high data density, for example dynamic random access memory (DRAM) type of applications, where speed and data capacity are key parameters, lower thermal stability of the data bits may be tolerable, or may be mitigated with reasonable amounts of error correction coding (ECC) to make the overall design function in the targeted regime of application. Perpendicular MRAM currently has a critical dimension of approximately 30 nano meters (nm) heading toward 10 nm.

Applications of MRAM generally include a reference MRAM data bit, which provides a reference resistance for comparing the reference bits to the MRAM data bits to indicate whether or not the data bits are in high resistance or low resistance state. The reference bit is desired to be made of identical MRAM cell structure as that of the data bit because it simplifies both the fabrication process and the circuit design than the case where the reference bit is made of a pure resistor without a MTJ structure.

With MRAM reference bit being identical to a data bit, the reference bit has the same low thermal stability problem as indicated hereinabove. The ECC is not correcting reference bit errors. Rather, a special data refreshing and assurance mechanism may be needed to make sure the reference bit is always in the correct state before any read operation on the data bits, which is costly both in design and in operation. Additionally, such refresh mechanism may slow down the operation speed of the device considerably and make the device not usable in high data rate applications.

What is needed is a perpendicular MRAM that has suitably high thermal stability characteristics in the reference bits allowing it to remain stable with high confidence during long-term operations without special refresh mechanisms required after initialization. Meanwhile, the data bits may still possess a comparatively lower thermal stability for fast and low power write operation.

SUMMARY OF THE INVENTION

To overcome the limitations in the prior art described above, and to overcome other limitations that will become apparent upon reading and understanding the present specification, the present invention discloses a method and a corresponding structure for a spin-transfer-torque magnetic random access memory (STTMRAM) device based on perpendicular MTJ. An STT effect is that in a magneto-resistive device (such as a magnetic tunnel junction (MTJ)), which has a junction layer sandwiched between two magnetic layers, when an electric current flows through the device in the direction perpendicular to the film plane, the conduction electrons can carry the magnetization information from one magnetic layer through the electrons' spins and inject that information into the other magnetic layer and leads to a magnetization orientation change of the other layer. For a magnetic random access memory using this STT effect to switch the free layer (data storage layer) of its magneto-resistive element, it is generally referred to as STTMRAM.

Briefly, an embodiment of the invention includes magnetic random access memory (MRAM) element is configured to store a state when electric current flows there through. The MRAM element includes at least one magneto tunnel junction (MTJ) configured to store a data bit with the at least one MJT including, a magnetic free layer (FL) having a switchable magnetization with a direction that is perpendicular to a film plane. The direction of magnetization of the FL is determinative of the data bit stored in the at least one MTJ. The at least one MTJ further includes a magnetic reference layer (RL) having a magnetization with a direction that is perpendicular to the film plane, and a magnetic pinned layer (PL) having a magnetization with a direction that is perpendicular to the film plane. The direction of magnetization of the RL and the PL are anti-parallel relative to each other, wherein when electric current is applied to the MRAM, the magnetization orientation of the FL switches during a write operation, whereas, the direction of magnetization the RL and the PL remain the same. The MRAM element further includes at least another MTJ configured to store a reference bit that is used to compare with the data bit to retrieve the digital information stored in the data bit.

These and other objects and advantages of the present invention will no doubt become apparent to those skilled in the art after having read the following detailed description of the preferred embodiments illustrated in the several figures of the drawing.

IN THE DRAWINGS

FIGS. 1 and 2 show a MRAM element 10 and a MRAM reference element 20 in accordance with one embodiment of the invention.

FIGS. 3-7 show a process for initializing the elements 10 and 20, during manufacturing or as needed, in accordance with a method of the invention FIGS. 8-12 show a process for initializing the elements 10 and 20, during manufacturing or as needed, in accordance with another method of the invention.

FIGS. 13 and 14 show a MRAM element 15 and a MRAM reference element 19 in accordance with another embodiment of the invention.

FIGS. 15-19 show a process for initializing the elements 15 and 19, during manufacturing or as needed, in accordance with a method of the invention.

DETAILED DESCRIPTION OF THE PREFERRED EMBODIMENT

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the invention.

Figure 2:
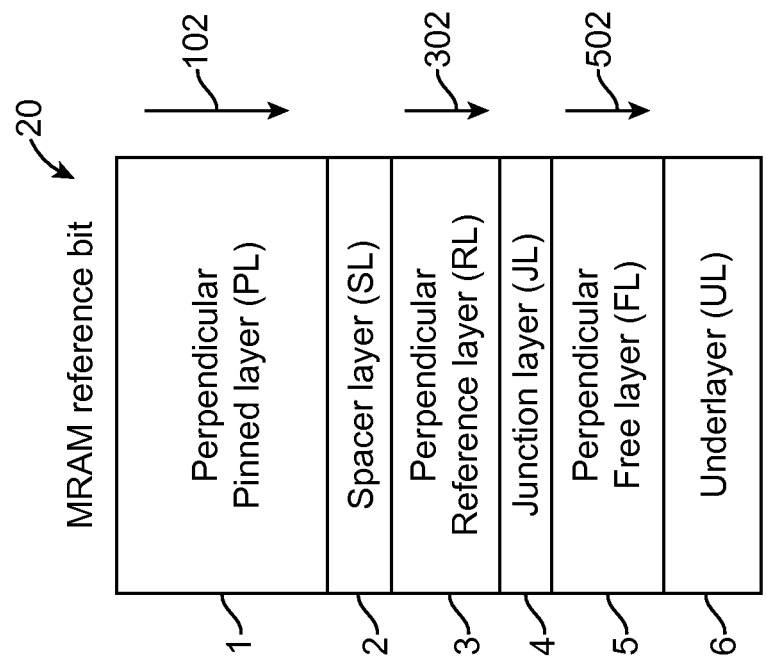
Figure 1:
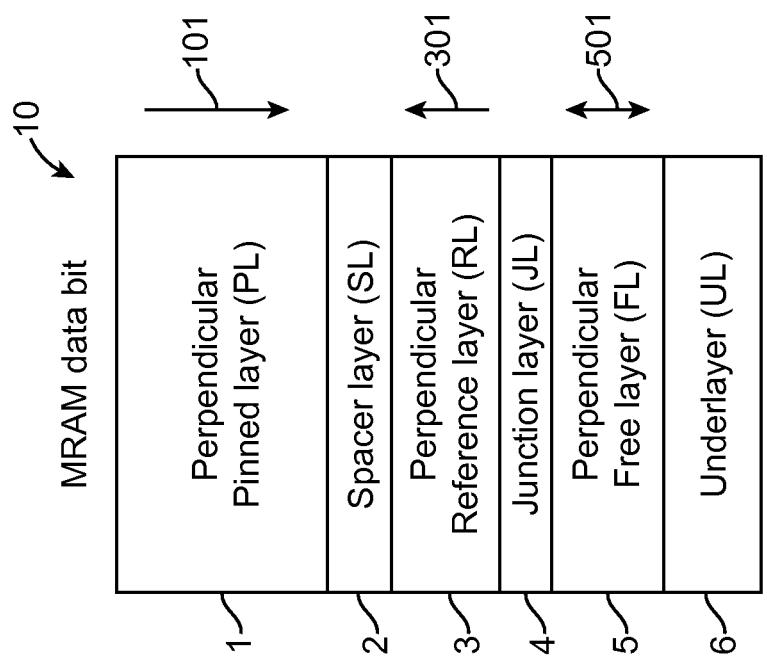
Figures 3, 4:
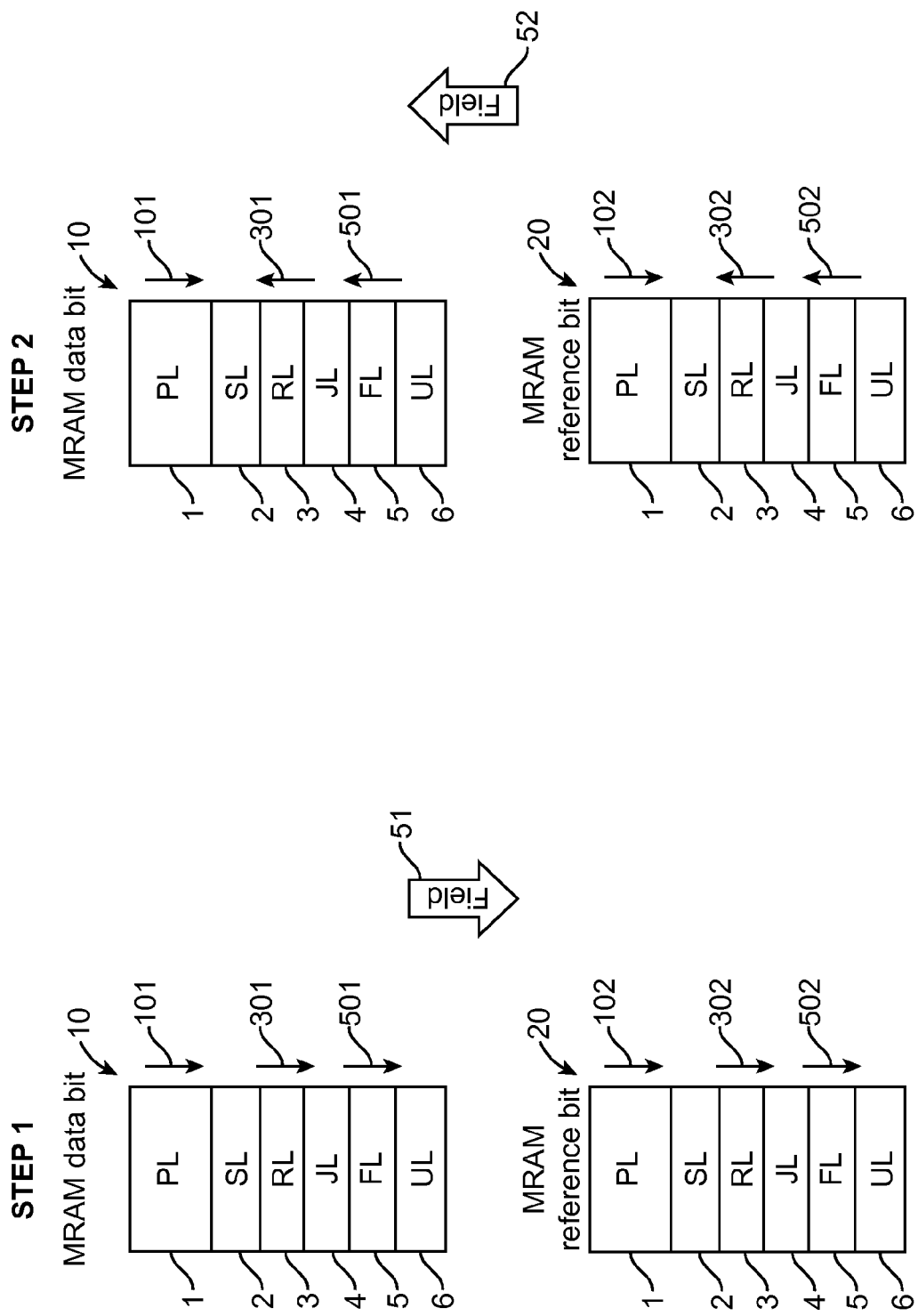

As known to those in the art, reference bits are used to read digital information stored in MRAM data storage elements by comparing the state of the MRAM data storage elements to an associated reference MRAM element and determining, based on this comparison, the resistance state of the MRAM element, i.e. the digital information of "1" or "0". With this in mind, FIGS. 1 and 2 show a MRAM element 10 and a MRAM reference element 20 in accordance with one of the embodiments of the invention. Each of the elements 10 and 20 are perpendicular in that their respective free layer (or "reference layer") has a magnetic anisotropy that is perpendicular to the film plane or substrate on which each element is formed.

The element 10 is shown to include an underlayer (UL) 6 formed on a substrate (not shown) on top of which is shown formed a perpendicular free layer (FL) 5 on top of which is shown formed a junction layer (JL) 4 (also known herein as "barrier layer" or "tunnel layer" or "barrier tunnel layer"), on top of which is shown formed a perpendicular reference layer (RL) 3 on top of which is shown formed a spacer layer (SL) 2 on top of which is shown formed a perpendicular pinned layer (PL) 1.

Similarly, the element 20 is made of the same layers as that of the element 10 but it serves as the reference bit to aid in reading the state of the element 10. Accordingly, the elements 10 and 20 are formed on the same die with analogous material and structures. At times, in this document, the element 10 is referred to as "MRAM data bit" or "data bit" and the element 20 is referred to as "MRAM reference bit" or "reference bit" because each of these elements stores one bit of digital information.

The FL 5, JL 4, RL 3, SL 2, and PL 1 generally make up a magnetic tunnel junction (MTJ). This applies to other embodiments of the invention.

The FL 5, RL 3, and PL 1 of each of the elements 10 and 20, each have a perpendicular magnetic anisotropy and a magnetization that is perpendicular to the film plane. Different magnetization states of the two bits, i.e. bits 10 and 20, are achieved after the completion of an initialization process. As shown in FIGS. 1 and 2 using the arrows 101, 301, 501, 102, 302, and 502, the PL 5 and the RL 3 of the element 10 each have magnetizations that are anti-parallel relative to each other while the PL 5 and the RL 3 of the element 20 have magnetizations that are parallel relative to each other and in the same direction as that of the magnetization of the FL 5 of the element 20. Meanwhile, FL 5 of element 10 is switchable in normal operation by programming current/voltage. FL 5 of element 20 stays in parallel to PL 1 and RL 3 direction.

In some embodiments, the JL 4 is made of magnesium oxide (MgO), or alumina, or copper (Cu), or Cu nano-pillars dispersed within an oxide layer. In some embodiments, the elements 10 and 20 are each spin transfer torque MRAM (STTMRAM) elements. When a different direction of electric current is applied to and flows through each of the elements 10 and 20, the magnetization of the FL 5, and the magnetization of the RL 3 in some embodiments, thereof may be switched into different orientation along the perpendicular direction due to the spin transfer torque between the FL 5 and the RL 3.

In some embodiments, the SL 2 of each of the elements 10 and 20 is made of non-magnetic material such as but not limited to, ruthenium (Ru), tantalum (Ta), titanium (Ti), MgO, Cu, halfnium (Hf), zinc oxide (ZnO), tantalum nitride (TaN), titanium nitride (TiN), IrMn, PtMn, FeRh or alumina. Further, the SL 2 may produce an anti-ferromagnetic coupling between the RL 3 and the PL 1, particularly when it is made of Ru, Cu or MgO.

In operation, with reference to the element 10, the effective (magnetic) field amplitude from the PL 1 to the FL 5 is Hstatic-1, the effective field amplitude from the RL 3 to the FL 5 is Hstatic-2. The coercivity field Hc is the magnetic field needed to switch the magnetization of the FL 5 magnetization 501. Still with reference to the element 10, due to the anti-parallel orientation of magnetization 101 of PL 1 and magnetization 301 of RL 3, the total field of the FL 5 to be overcome during switching of the element 10 is (Hstatic-1−Hstatic-2+Hc=Hc. Although Hstatic-1 and Hstatic-2 can be much larger than Hc, when Hstatic-1 and Hstatic-2 are similar strength, the direction of magnetization of the FL 5 switches easy due to the magnetic fields from the RL 3 and the PL 2 canceling each other and making Hstatic-1–Hstatic-2~0.

With reference to the element 20, the effective field from the PL 1 to the FL 5 is Hstatic-1, and the effective field from the RL 3 to the FL 5 is Hstatic-2. The coercivity field, Hc, represents the magnetic field needed to switch the magnetization of the FL 5 magnetization 502. Relative to the element 10, the total field on the FL 5 to be overcome during switching is Hstatic-1+Hstatic-2+Hc–2Hstatic+Hc, when Hstatic-1 and Hstatic-2 are similar strength. Even though Hc is small, when FL 5 magnetization 501 is in same direction as magnetizations 102 or PL 1 and 302 of RL 3, with large Hstatic-1 and Hstatic-2, it is hard to switch the magnetization 502 of the FL 5 to anti-parallel direction to magnetization 302 of RL 3, due to the high effective field acting on FL 5. Thus, the parallel state of reference bit, element 20, is stable against external excitations, including thermal agitation, i.e. with high thermal stability, as well as disturbance caused by read procedure.

FIGS. 3-7 show the steps performed during an initialization process of each of the elements 10 and 20, in accordance with a method of the invention. At step 1, in FIG. 3, a magnetic field 51, in the direction shown of the arrow, is applied to the elements 10 and 20. The field 51 is strong enough to magnetize all of the magnetic layers of the elements 10 and 20, such as the RL 3 and the FL 5 and the PL 1, in the direction shown as the direction of the arrow showing field 51. Next, at step 2, shown in FIG. 4, the field 52 is applied, opposing the field 51 but field 52 is not able to switch the PL 1 in either the element 10 or 20 but it is able to switch the magnetization of both of the layers FL 5 and RL 3 such that the magnetizations 301 and 302 of the RL 3 are oriented anti-parallel relative to that of the PL 1 in both the element 10 and the element 20.

Figures 5, 6:
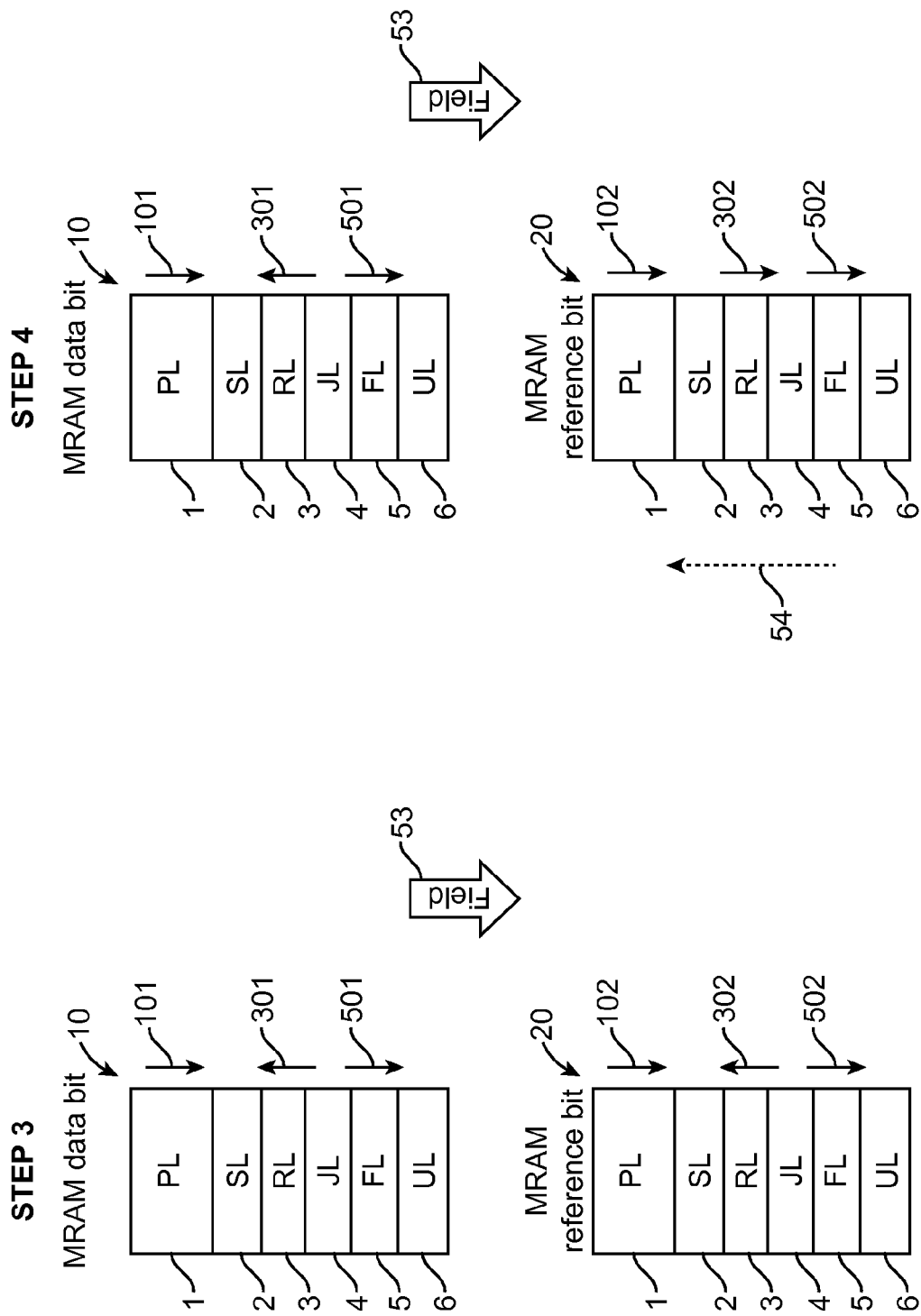

As shown in FIG. 5, a third (magnetic) field 53 is applied to the element 10 and the element 20. The field 53 is in the same direction as that of the field 51. However, field 53 is not strong enough to switch the magnetization of the RL 3 and the PL 1, but it is suitable to switch the magnetization of the FL 5 to be in the same direction as that of the PL 1 in both the element 10 and the element 20. Accordingly, as shown in FIG. 5, the magnetization direction, shown by the arrow 501 and 502, is in the same direction as that of the arrow 101 and 102. However, the field 53 significantly reduces energy barrier to switch the magnetization of the RL 3 in both bits 10 and 20.

Next, in FIG. 6, an electric current is applied but only to the reference bit, or element 20, and not to the data bit, or element 10, with electrons flow from the FL 5 to the RL 3 as shown by arrow 54. Even with the field 53 applied to the element 10, the RL 3 thereof remains unchanged in element 53 in the absence of the electric current. With the field 53 and spin transfer torque (STT) applied to the element 20 by the electric current at the same time, the magnetization 302 of the RL 3 of the element 20 switches to become parallel (or in the same direction) to the magnetizations 502 and 102 of the PL 1 and the FL 5, and thus a desired and rather solid parallel magnetic state of the element 20 is advantageously achieved Switching of the RL 3 of the element 20 may be monitored by the resistance change across the element 20. Alternatively, it is not monitored at all when the current 54 is high enough to switch the magnetization of the RL 3 with high confidence.

Figure 7:
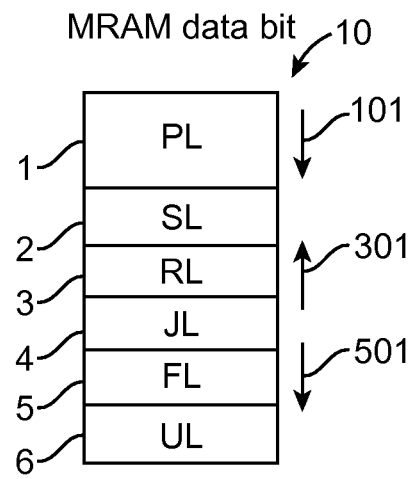
Figure 7:
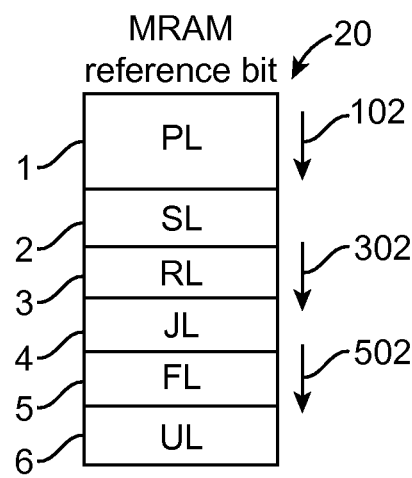

Next, in FIG. 7, the field 53 and the current 54 are removed. Preferably the current 54 is removed before the filed 53 is removed, so that the electric current in element 20 does not inadvertently switch the magnetization 502 of FL 5 to anti-parallel to 302 of RL 3 when there is no magnetic field 53 to assist FL 5 magnetization orientation. As shown in FIG. 7, the state of the element 10 results with the direction of magnetizations of the RL 3 and the PL 1, shown by the arrows 301 and 101, respectively, being anti-parallel relative to each other. Similarly, the state of the element 20 results with the direction of magnetizations of the FL 5, the RL 3, and the PL 1, each being parallel relative to the other and therefore advantageously causing a deep or strong parallel state of the element 20.

FIGS. 8-12 show a process for initializing the elements 10 and 20, during manufacturing or as needed, in accordance with another embodiment of the invention.

Figure 8:
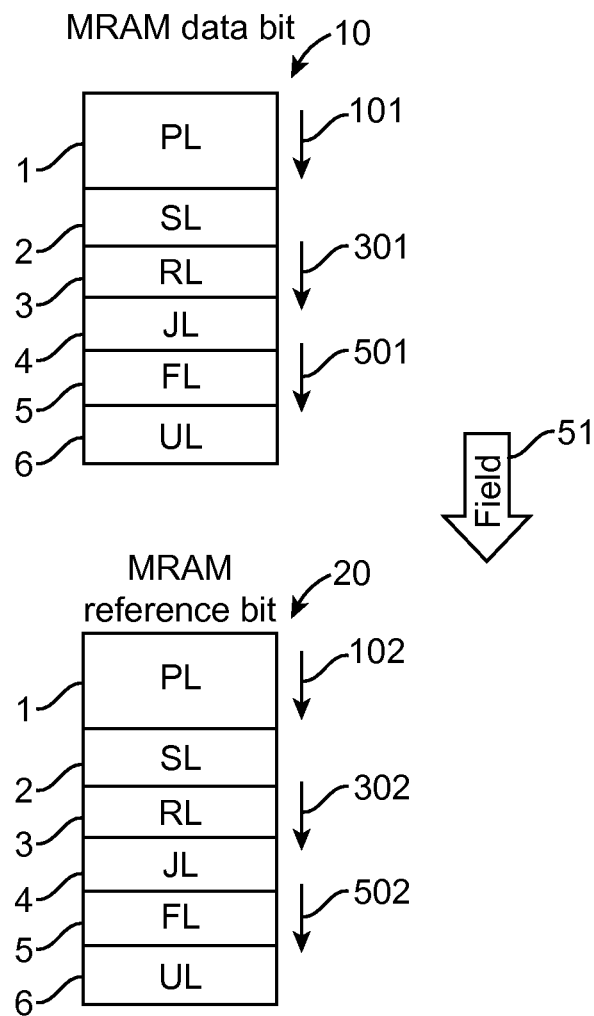

In step 1, of FIG. 8, a first field 51 is applied, in a direction shown by the arrow associated with the field 51 in FIG. 8, to the elements 10 and 20 that is suitably strong enough to magnetize all magnetic layers of the elements 10 and 20 into being in the same direction as the direction of the field 51.

Figure 9:
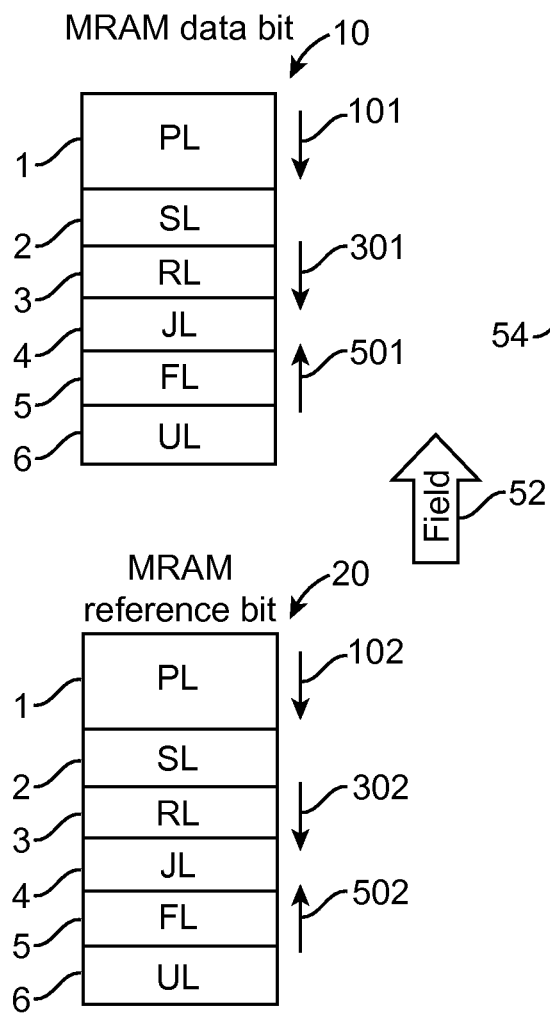

As step 2, in FIG. 9, a second field 52 is applied to the elements 10 and 20, in a direction shown by the arrow associated with the field 52 and one that opposes the direction of the field 51. However, the field 52 is not strong enough to switch the magnetization of the RL 3 and the PL 1 but it is capable of switching the magnetization of the FL 5 into a direction opposite to that of the RL 3 and the PL 1 of the elements 10 and 20. This field 52 also significantly reduces the energy barrier to switch the magnetization of the RL 3 in all bits.

Figure 10:
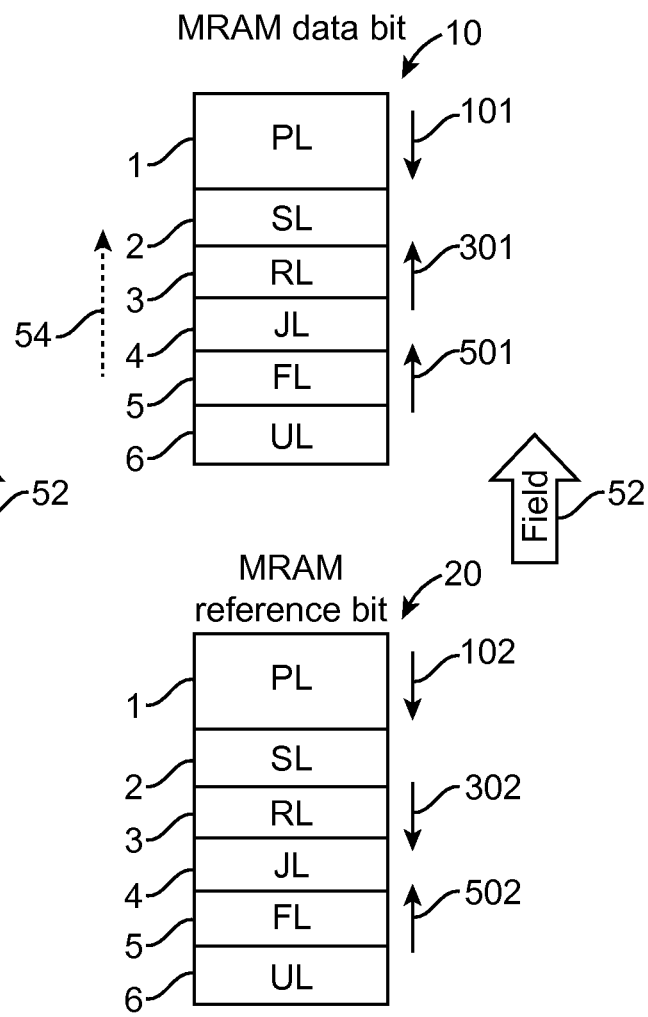

Next, as shown in FIG. 10, an electric current is applied only to the data bit or element 10 and not to the reference bit, or element 20, where electrons flow from the FL 5 to the RL 3 as show by arrow 54. With the absence of the electric current, the magnetization 302 of the RL 3 of the reference bit element 20 remains unchanged. With field 52 and STT by the electric current applied simultaneously to the data bit element 10, the magnetization 301 of the RL 3 of the data bit switches to a parallel state in the same direction as the magnetization 501 of the FL 5 and anti-parallel relative to the magnetization 101 of the PL 1.

Switching of the RL 3 of the data bit may be monitored by the resistance change across the data bit. Alternatively, it is not monitored at all when the current 54 is high enough to switch the magnetization of the RL 3 of the data bit with high confidence.

Figure 11:
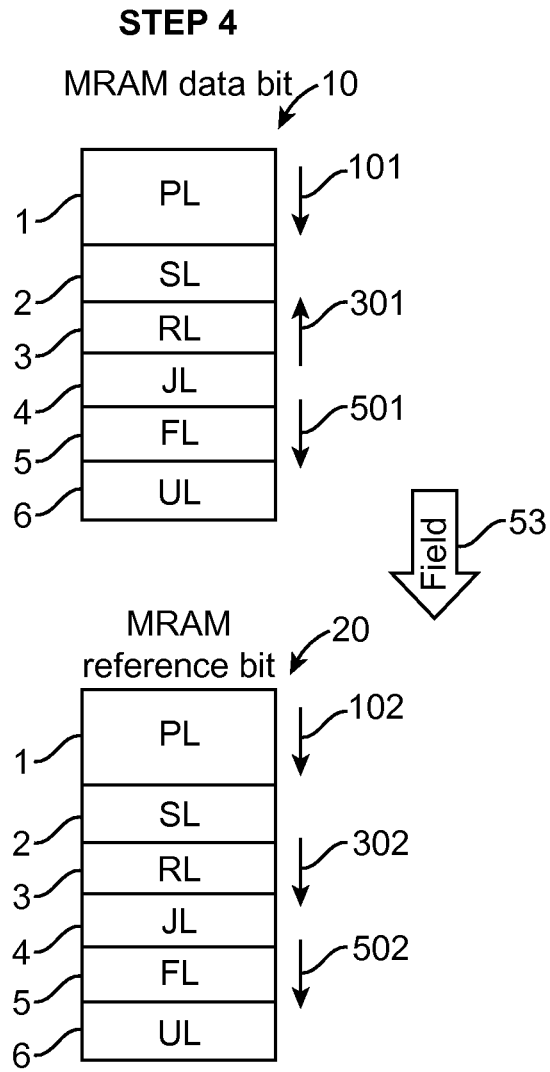

Next, as shown in FIG. 11, the field 52 and the current 54 are removed. Then, a third field 53 is applied that is in same direction as that of the field 51. Field 53 is not strong enough to switch the magnetizations of the RL 3 and the PL 1 but it is capable of switching the magnetization of the FL 5 to be in the same direction as that of the PL 1 for both elements 10 and 20. Alternatively, the field 53 switches the magnetization 502 of FL 5 of the element 20, and not the FL 5 of the element 10. Optionally, at step 4, after the field 52 and the current 54 are removed, without applying magnetic field 53, an electric current 55, not shown in FIG. 11, is applied to the reference bit 20 only with electrons flowing from the RL 3 to the FL 5, such that the FL 5 is switched along the same direction as that of the PL 1 and the RL 3 in the reference bit 20.

Still optionally, after the field 52 and the current 54 are removed, without applying field 53, reference bit's FL 5 switches from an anti-parallel state to parallel state, relative to that of the PL 1 and the RL 3, due to the combined magnetic field from the RL 3 and the PL 1.

Figure 12:
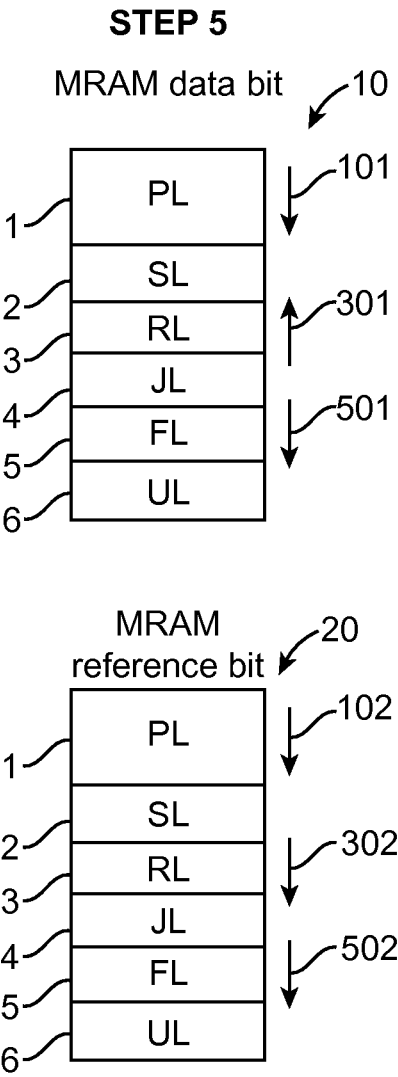

Next, as shown in FIG. 12, all fields and current applied to either the data bit or the reference bit is removed. The data bit 10 remains in the state where the magnetization of its RL 3 and PL 1 are anti-parallel relative to each other. The reference bit 20 remains in the state with the magnetization of its FL 5, RL 3 and PL 1 being parallel relative to each other, i.e. deep (or strong) parallel state.

Figure 14:
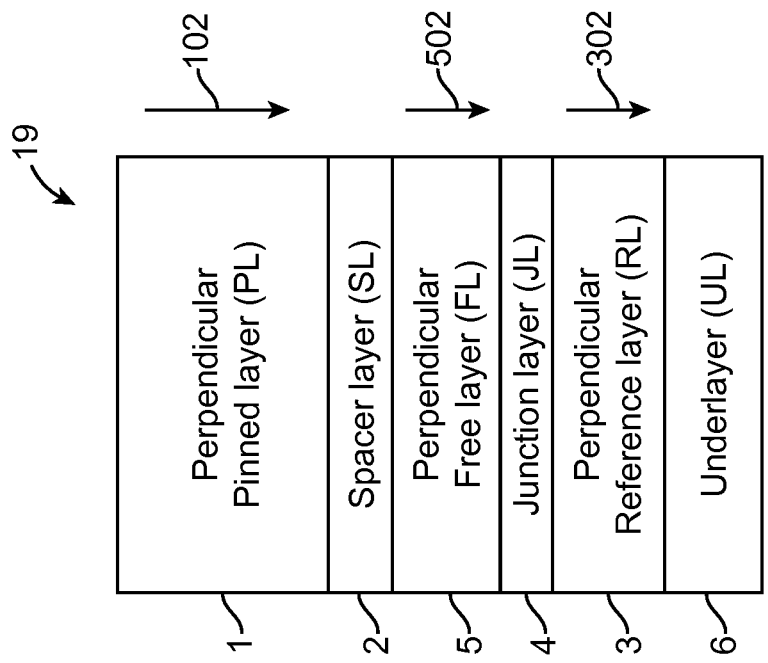
Figure 13:
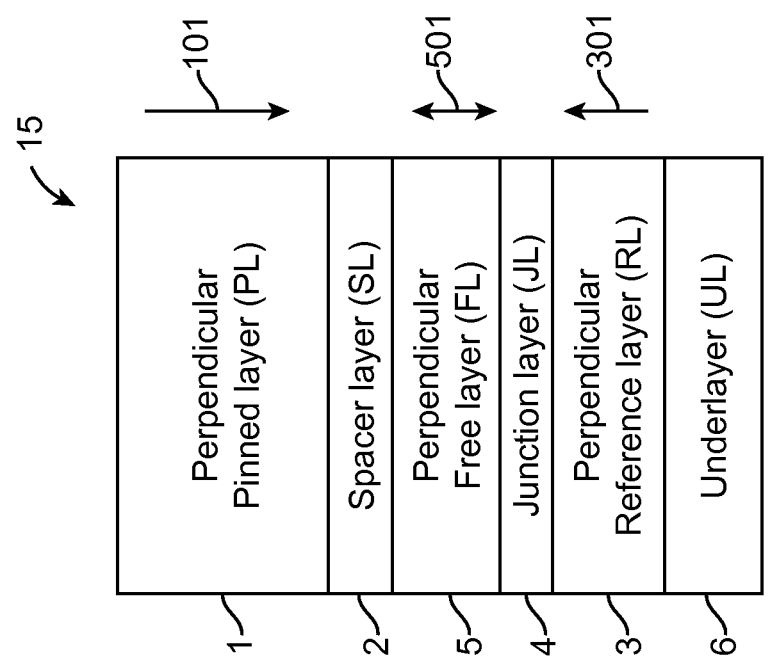

FIGS. 13 and 14 show a MRAM element 15 and a MRAM reference element 19 in accordance with another embodiment of the invention. Each of the elements 15 and 19 are perpendicular in that their respective FL5, RL 3 and PL 1 have magnetizations and magnetic anisotropy that are perpendicular to the film plane or substrate on which each element is formed.

The element 15 is analogous to the element 10 however, its reference layer 3 and pinned layer 1 are on an opposite side of its junction layer, in contrast to the element 10. The element 15 is shown to include an UL 6 formed on a substrate (not shown) on top of which is shown formed a perpendicular RL 3 on top of which is shown formed a JL 4 (also known herein as "barrier layer" or "tunnel layer" or "barrier tunnel layer"), on top of which is shown formed a perpendicular FL 5 on top of which is shown formed a SL 2 on top of which is shown formed a perpendicular PL 1.

Similarly, the element 19 is analogous to the element 20, with the exceptions stated above, and is made of the same layers as that of the element 15 but it serves as the reference bit to aid in reading the state of the element 15. Accordingly, the elements 15 and 19 are formed on the same die with analogous material and structures. At times, in this document, the element 15 is referred to as "MRAM data bit" or "data bit" and the element 19 is referred to as "MRAM reference bit" or "reference bit" because each of these elements stores one bit of digital information.

The FL 5, RL 3, and PL 1 of each of the elements 15 and 19, each have a perpendicular magnetic anisotropy and a magnetization that is perpendicular to the film plane. Different magnetization states of the two bits, i.e. bits 15 and 19, especially for RL 3, are achieved after the completion of an initialization process.

As shown in FIGS. 13 and 14 using the arrows 101, 301, 501, 102, 302, and 502, the PL 1 and the RL 3 of the element 15 each have magnetizations that are anti-parallel relative to each other, as shown by the arrows 101 and 301, respectively, and the magnetization of the FL 5 is shown to be switchable, as shown by the arrow 501. The PL 1, FL 5, and the RL 3 of the element 19 each have magnetizations that are parallel relative to each other and in the same direction as one another, as shown by the arrows 302, 502, and 102.

Different magnetization states of the two bits, 15 and 19, are achieved after the completion of the initialization process. As noted, the magnetization of the PL 1 and the RL 3 are each anti-parallel relative to each other in the element 15 and parallel relative to each other and in same direction as that of the FL 5 in the element 19. The JL 4 may be made of, but not limited to, MgO, alumina, Cu and Cu nano-pillars within an oxide layer. When different direction of electric current is applied through the element 15, the magnetization of the FL 5 may be switched into a different orientation along with the perpendicular direction due to the spin transfer torque from the RL 3 in the element 15.

The SL 2 of both the element 15 and the element 19 may be made of a non-magnetic layer such as, but not limited to, Ru, Ta, Ti, MgO, Cu, Hf, ZnO, TaN, TiN, IrMn, PtMn, FeRh, or alumina. The SL 2 may produce an anti-ferromagnetic coupling between the FL 5 and the PL 1 and made of Ru, Cu or MgO.

FIGS. 15-19 show a process of initialization the elements 15 ad 19, in accordance with another method of the invention. In FIG. 15, a first field 51 is applied to the elements 15 and 19 that are strong enough to magnetize all of the magnetic layers of these elements such that they all have magnetizations that are in the same direction as that of the field 51. Next, in FIG. 16, a second field 52 is applied that opposes the field 51 in direction and is not capable of switching the magnetization of the PL 1 but it is capable of switching the magnetization of both the FL 2 and the RL 3 in all bits—elements 15 and 19. Thus, the magnetization of the RL 3 is oriented anti-parallel relative to that of the PL 1.

Figure 17:
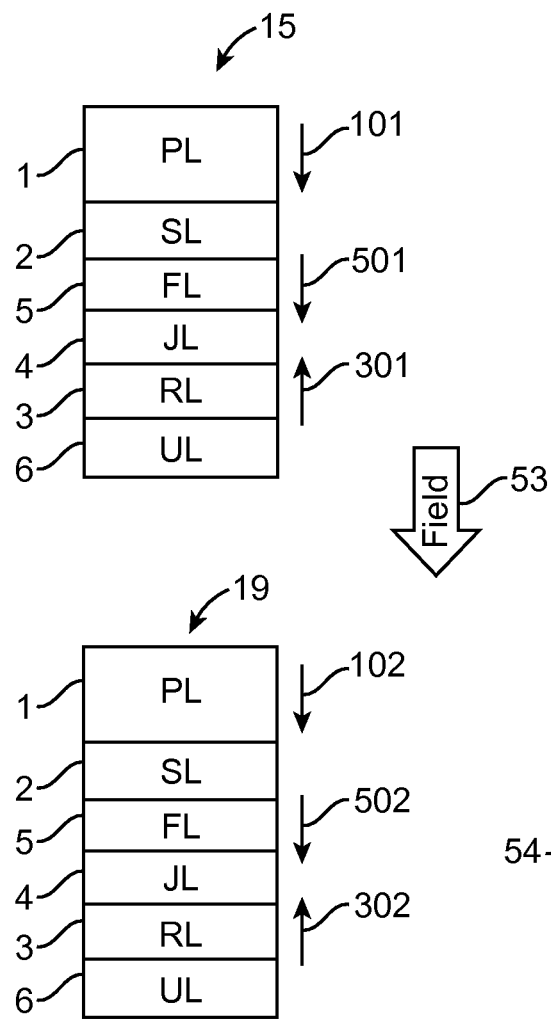

FIG. 17 shows the next step, which is application of a third field 53, in the same direction as that of the filed 51, to the elements 15 and 19. The field 53 is not strong enough to switch the magnetization of the RL 3 and the PL 1 but it is capable of switching the magnetization of the FL 5 to be in the same direction as that of the PL 1 in both the element 19 and the element 15. Advantageously, the field 53 significantly reduces the energy barrier required to cause switching of the RL 3 in elements 15 and 19.

Figure 18:
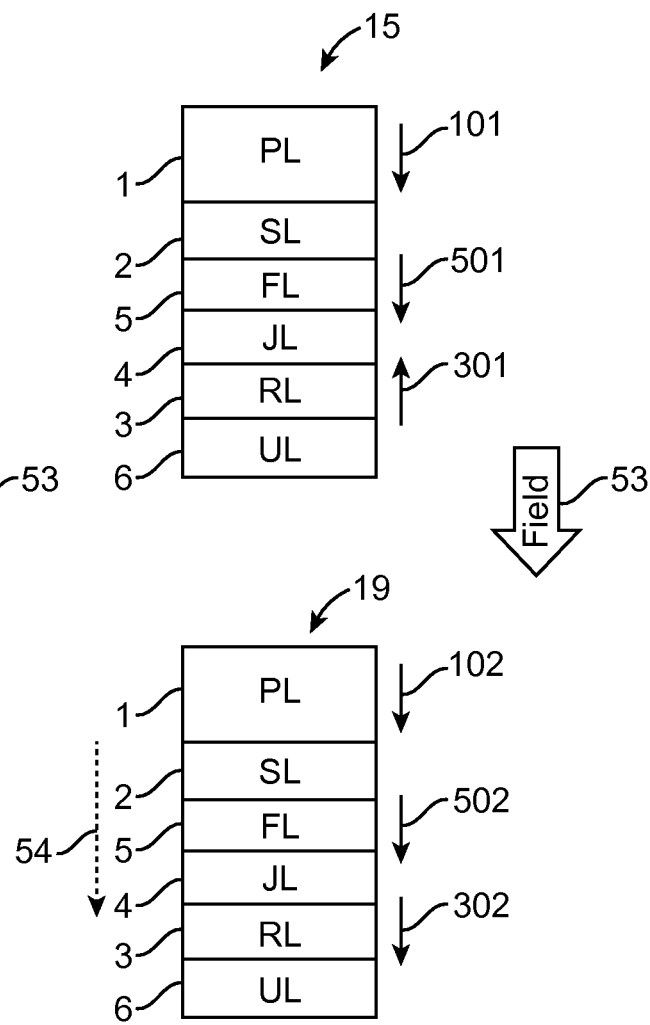

In FIG. 18, while field 53 is being applied, an electric current is applied only to the reference bit, or element 19, and not to the data bit with electrons flowing from the FL 5 to the RL 3 as shown by the arrow 54. Even with the field 53 applied, the RL 3 of the element 15 remains unchanged. With the field 53 and current spin transfer torque (STT) applied to the reference bit, element 19, at the same time, the magnetization 302 of the reference bit the RL 3 switches parallel to the magnetizations of the PL 1 and the FL 5, and the reference bit is, advantageously, in a deep or very stable parallel state.

The switching of the magnetization of the RL 3 of the element 19 may be monitored by the resistance change across the reference bit 19. Alternatively, it is not monitored at all when the current 54 is high enough to switch the magnetization of the RL 3 with a high degree of confidence.

Figure 19:
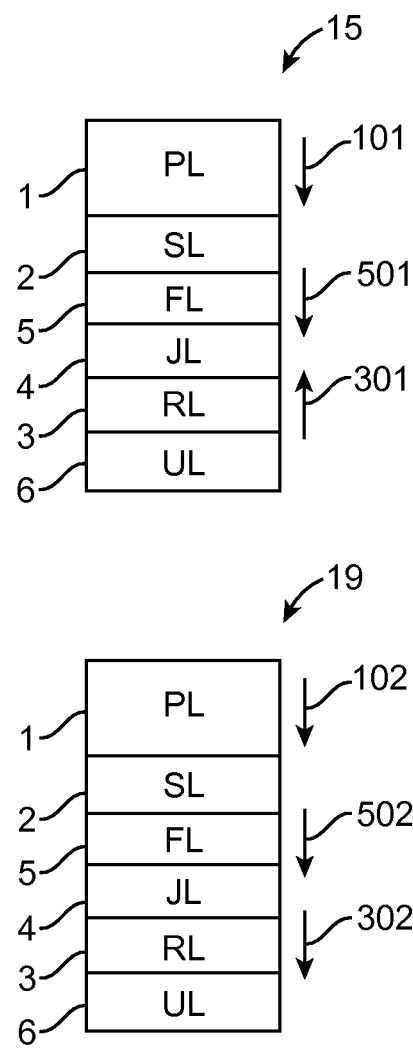

FIG. 19 shows the next step performed after the step of FIG. 18, where the field 53 and the current 54 are removed. Preferably the current 54 is removed before the field 53 is removed. The element 15 remains in the state with the magnetization of its RL 3 and PL 1 being in an anti-parallel state relative to each other. The element 19 remains in the state that has the magnetization of its FL 5, RL 3, and PL 1 all being in parallel relative to each other, i.e. deep parallel state.

Figure 20:
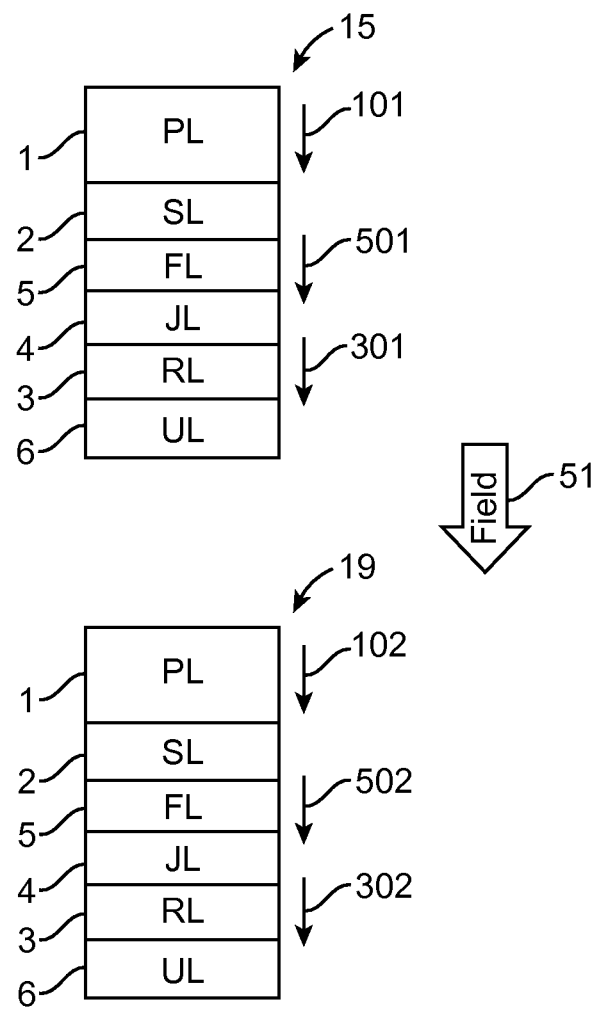
FIGS. 20-24 show a process for initializing the elements 15 and 19, during manufacturing or as needed, in accordance with another method of the invention

FIGS. 20-24 show the steps for initializing the elements 15 and 19, in accordance with another method of the invention. In FIG. 20, a first field 51 is applied to the elements 15 and 19 and it is strong enough to magnetize all magnetic layers into same direction as that of the field 51.

Figure 21:
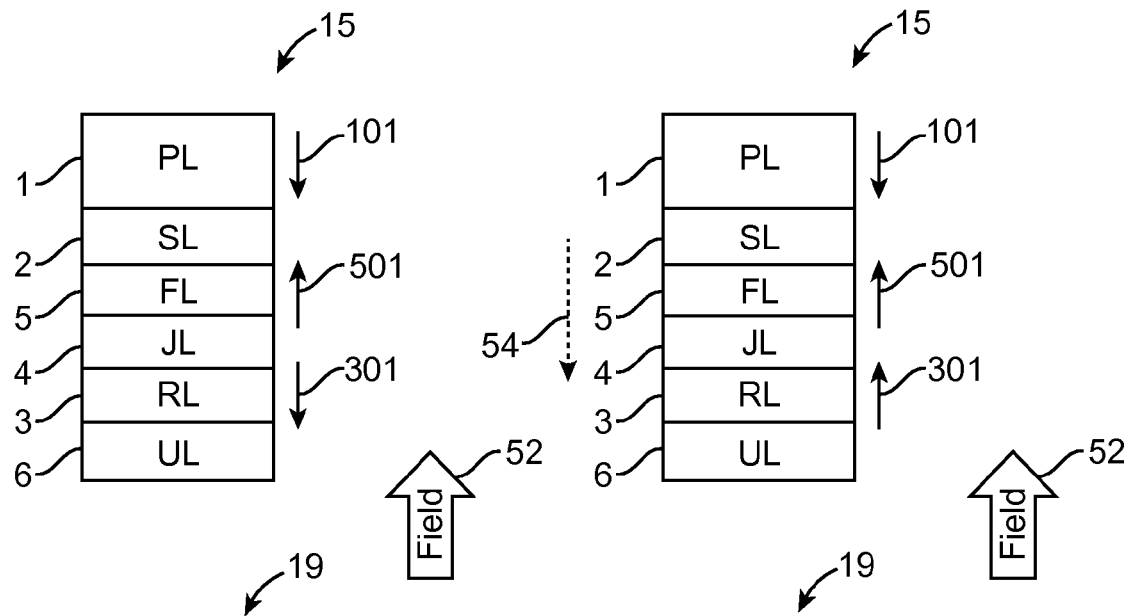

In FIG. 21, a second field 52 is applied, opposing the field 51. The field 52 is not strong enough to switch the magnetization of the RL 3 and the PL 1 but it is capable of switching the magnetization of the FL 5 in a direction that is opposite to that of the RL 3 and the PL 1 in the elements 15 and 19. The field 52 significantly reduces the energy barrier required to switch the magnetization of the RL 3 in the elements 15 and 19.

Figure 22:
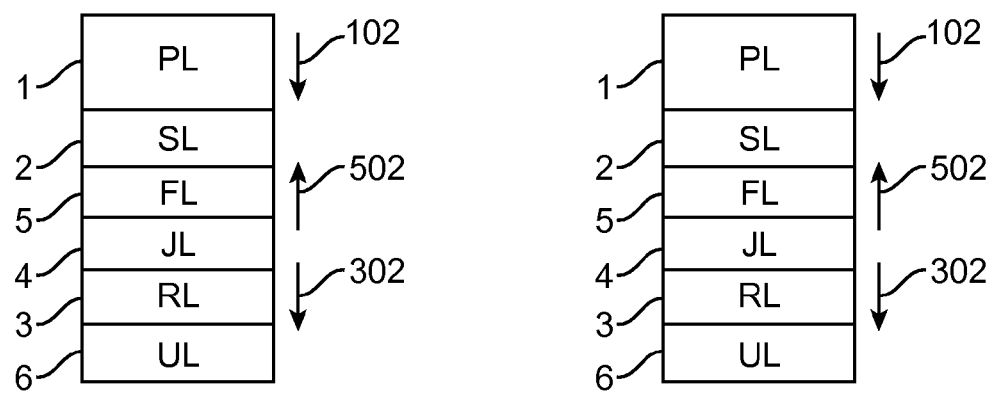

In FIG. 22, an electron current is applied only to the data bit, and not to the reference bit, where electrons flow from the FL 5 to the RL 3 as shown by arrow 54. Under the field 52, the reference bit RL 3's magnetization remains unchanged. With the application of the field 52 and the electric current STT, applied simultaneously to the data bit, the magnetization of the RL 3 of the element 15 switches to a parallel state, resembling the magnetization of the FL 5 but being anti-parallel relative to the magnetization of the PL 1. Switching of the magnetization of the element 15's RL 3 may be monitored by monitoring the resistance change across the data bit. Alternatively, it is not monitored at all when the current 54 is high enough to switch the magnetization of the RL 3 of the element 15 with high confidence (or great reliability).

Figure 23:
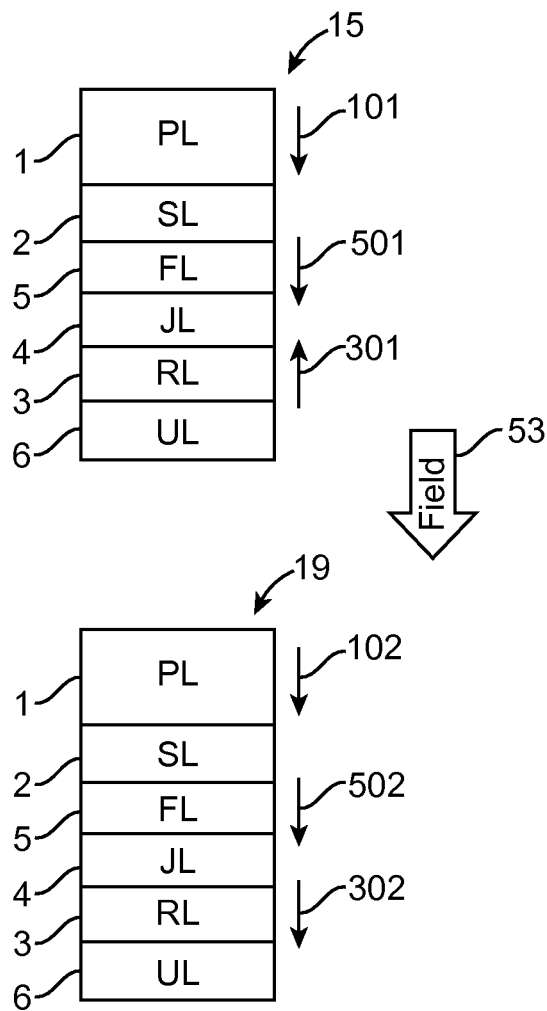

In FIG. 23, optionally, the field 52 and the current 54 are removed, preferably in the order of removing the current 54 prior to removing the field 52. Subsequently, the third field 53, which is in same direction as that of the field 51, is applied to the elements 15 and 19. The field 53 is not strong enough to switch the magnetizations of the RL 3 and the PL 1 but it is capable of switching the magnetization of the FL 5 to be in the same direction as that of the PL 1 in the elements 15 and 19 and alternatively, only in the element 19.

Still optionally the current 54 is removed and the field 52 is also removed. An electric current 55 is applied to the reference bit with electrons flowing from the RL 3 to the FL 5, so that the magnetization of the FL 5 is switched in a direction that is the same as that of the PL 1 and the RL 3 in the reference bit.

Still alternatively, the current 54 is removed and the field 52 is also removed allowing the magnetization 502 of the FL 5 of the element 19 to switch to be in a parallel state relative to that (102 and 302) of the PL 1 and the RL 3 due to the combined magnetic field from the RL 3 and the PL 1 in the element 19.

Figure 24:
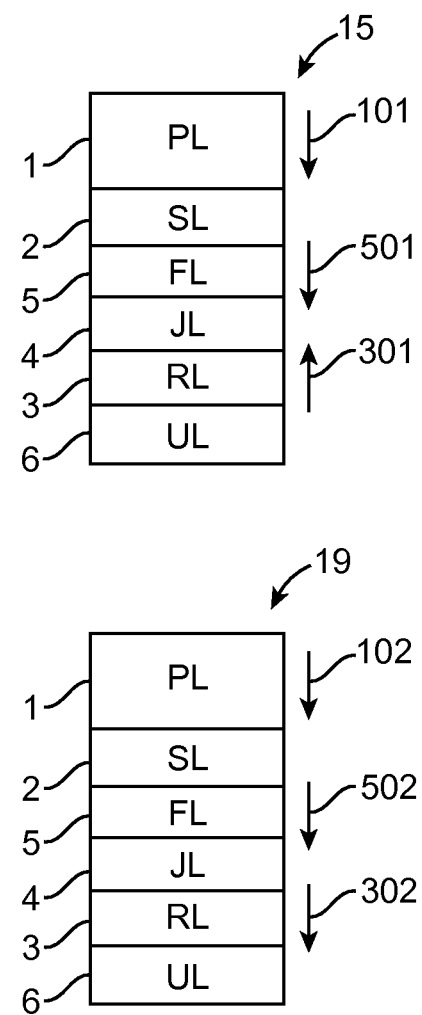

Next, as shown in FIG. 24, the field and current applied to either the element 15 or the element 19 is removed. The element 15 remains in the state where it's RL 3 and PL 1's magnetizations are anti-parallel relative to each other. The element 19 remains in the state where its FL 5, RL 3, and PL 1's magnetizations are parallel relative to each other resulting in a deep (or reliable) parallel state.

It is understood that while only one bit is represented and shown in the various embodiments and methods of the invention, a memory array may employ and typically does employ a large number of data bits and reference bits. In some embodiments, the data bits are stacked on top of each other and the reference bits are stacked on top of each other but other arrangements are contemplated.

MTJ structures from layer 1 to layer 5, in all embodiments as disclosed above can be up-side down from what is shown in the figures.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A magnetic random access memory (MRAM) whose memory elements are configured to store a state when electric current flows therethrough comprising:
    a plurality of magnetic tunnel junctions (MTJs) including at least one data bit MTJ and at least one reference bit MTJ,
    each of the plurality of MTJs including,
        a free layer (FL) having a switchable magnetization with a direction that is perpendicular to a film plane, the direction of magnetization of the FL being determinative of data stored in the MTJ;
        a reference layer (RL) having a fixed magnetization with a direction that is perpendicular to the film plane; and
        a pinned layer (PL) having a fixed magnetization with a direction that is perpendicular to the film plane,
        wherein the directions of magnetization of the RL and that of the PL of the data bit MTJ are anti-parallel to each other;
        further wherein the reference bit MTJ is used to compare with the data bit MTJ to retrieve the data stored in the data bit MTJ, the directions of magnetizations of the RL and the PL of the reference bit MTJ being parallel to each other.

2. The MRAM of claim 1, wherein each of the plurality of MTJs further includes a junction layer (JL) positioned between the FL and the RL, wherein a change of the magnetization direction of the FL relative to the magnetization of the RL produces a resistance change across the data bit MTJ.

3. The MRAM of claim 1, wherein each of the plurality of MTJs further includes a spacer layer (SL) disposed immediately adjacent to the PL.

4. The MRAM of claim 1, wherein the plurality of MTJs are formed on a same die.

5. The MRAM of claim 1, wherein the plurality of MTJs have substantially a same structure.

6. The MRAM of claim 1, wherein the directions of magnetizations of the RL and PL of the data bit MTJ and that of the reference bit MTJ are effectuated either during manufacturing of the MRAM element or thereafter.

7. The MRAM of claim 2, wherein the JL is made of a material comprising: magnesium oxide (MgO), alumina, zirconium oxide (ZnO), copper (Cu), or Cu nano-pillars within an oxide.

8. The MRAM of claim 1, wherein the direction of the magnetization of each of the data bit MTJs is switched by spin transfer torque (STT) effect from the electric current flowing through the each of the data bit MTJs.

9. The MRAM of claim 2, wherein the PL and RL are disposed on a same side of the JL opposing the FL in each MTJ.

10. The MRAM of claim 9, wherein each MTJ further includes a spacer layer (SL) disposed immediately adjacent to the PL, the PL being separated from the RL by the SL.

11. The MRAM of claim 2, wherein the PL and FL are disposed on a same side of the JL and opposing the RL in each MTJ.

12. The MRAM of claim 11, wherein each MTJ further includes a spacer layer (SL) disposed immediately adjacent to the PL, wherein the PL is separated from the FL by the SL.

13. The MRAM of claim 3, wherein the SL is made of a non-magnetic layer.

14. The MRAM of claim 13, wherein the SL is made of a material comprising: ruthenium (Ru), tantalum (Ta), titanium (Ti), magnesium oxide (MgO), copper (Cu), hafnium (Hf), zirconium oxide (ZnO), iron manganese (IrMn), platinum manganese (PtMn), iron ruthenium (FeRu), or alumina.

15. The MRAM of claim 10, wherein the SL produces an anti-ferromagnetic exchange coupling between the RL and the PL.

16. The MRAM of claim 10, wherein the SL eliminates any type of exchange coupling between the RL and the PL.

17. The MRAM of claim 10, wherein the SL produces a ferromagnetic exchange coupling between the RL and the PL.

18. The MRAM of claim 12, wherein the SL produces an anti-ferromagnetic exchange coupling between the FL and the PL.

19. The MRAM of claim 12, wherein the SL substantially eliminates any type of exchange coupling between the FL and the PL.

20. The MRAM of claim 15, wherein the SL produces a ferromagnetic exchange coupling between the FL and the PL.

21. The MRAM of claim 1, wherein the PL produces an effective perpendicular magnetic field that is operable to reduce an effective perpendicular magnetic field produced by the RL within the FL of the data bit MTJ.

22. The MRAM of claim 1, wherein the PL produces an effective perpendicular magnetic field that is operable to enhance an effective perpendicular magnetic field produced by the RL within the FL of the reference bit MTJ.

23. A magnetic random access memory (MRAM) whose memory elements are configured to store a state when electric current flows therethrough comprising:

a plurality of magnetic tunnel junctions (MTJs) having a same structure, the MTJ of each of which including,
a magnetic free layer (FL) having a first magnetization;
a magnetic reference layer (RL) having a second magnetization;
a magnetic pinned layer (PL) having a third magnetization; and
a junction layer (JL) positioned between the FL and the RL,
wherein a change of the first magnetization direction relative to the second magnetization produces a resistance change across the MTJ,
wherein at least one of the plurality of MTJs is a data bit MTJ,
wherein at least one of the plurality of MTJs is a reference bit MTJ that is used to compare with the data bit MTJ to retrieve the data stored in the data bit MTJ,
further, wherein the directions of the second magnetization and the third magnetization are anti-parallel in the data bit MTJ while being parallel in the reference bit MTJ.

24. The MRAM of claim 23, wherein the first magnetization, the second magnetization and the third magnetization are all perpendicular to film planes of the magnetic FL, the magnetic RL, and the magnetic PL.

25. The MRAM of claim 23, wherein the magnetic RL and the magnetic PL each has associated therewith a perpendicular field component produced in the magnetic FL, and the perpendicular field components of the magnetic RL and the magnetic PL substantially cancel each other in the magnetic FL of the data bit MTJ.

26. The MRAM of claim 23, wherein the magnetic RL and the magnetic PL each has associated therewith a perpendicular field component produced in the magnetic FL, and the perpendicular field components of the magnetic RL and the magnetic PL enhance each other in the magnetic FL of the reference bit MTJ.

27. The MRAM of claim 23, wherein the magnetic RL and the magnetic PL each has associated therewith a field component produced in the magnetic FL, and the field components of the magnetic RL and the magnetic PL substantially cancel each other in the magnetic FL of the data bit MTJ.

28. The MRAM of claim 23, wherein the magnetic RL and the magnetic PL each has associated therewith a field component produced in the magnetic FL, and the field components of the magnetic RL and the magnetic PL enhance each other in the reference bit MTJ.

29. The MRAM of claim 23, wherein the plurality of MTJs are formed on a same die.

30. A magnetic random access memory (MRAM) whose memory elements are configured to store a state when electric current flows therethrough comprising:
a plurality of magnetic tunnel junctions (MTJs) having an identical structure, an MTJ of the plurality of MTJs including,
at least one magnetic free layer (FL) having a first magnetization;
at least one magnetic reference layer (RL) having a second magnetization; and
at least one magnetic pinned layer (PL) having a third magnetization,
wherein directions of the second magnetization and the third magnetization are anti-parallel in at least a first MTJ while being parallel in at least a second MTJ, and
wherein in the first MTJ, the first magnetization switches during a write operation while the second and the third magnetizations are unchanged.

31. The MRAM of claim 30, wherein the first magnetization, the second magnetization and the third magnetization are all perpendicular to film planes of the magnetic FL, the magnetic RL and the magnetic PL.

32. The MRAM of claim 31, wherein perpendicular field components from the magnetic RL and the magnetic PL substantially cancel each other in the magnetic FL of the first MTJ.

33. The MRAM of claim 31, wherein perpendicular field components from the magnetic RL and the magnetic PL enhance each other in the magnetic FL of the second MTJ.

34. The MRAM of claim 30, wherein at least one magnetic field component from each of the magnetic RL and the magnetic PL substantially cancel each other in the magnetic FL of the first MTJ.

35. The MRAM of claim 34, wherein the at least one magnetic field component from each of the magnetic RL and the magnetic PL enhance each other in the magnetic FL of the second MTJ.

36. The MRAM of claim 30, wherein the plurality of MTJs are formed on a same die.

* * * * *